(12) United States Patent
Fan et al.

(10) Patent No.: US 11,462,590 B2
(45) Date of Patent: Oct. 4, 2022

(54) DISPLAY SCREENS AND DISPLAY DEVICES

(71) Applicants: Yungu (Gu' an) Technology Co., Ltd., Langfang (CN); Kunshan Go-Visionox Opto-Electronics Co., Ltd., Kunshan (CN)

(72) Inventors: Longfei Fan, Langfang (CN); Hui Zhu, Langfang (CN); Mingxing Liu, Kunshan (CN)

(73) Assignees: YUNGU (GU'AN) TECHNOLOGY CO., LTD., Langfang (CN); KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 382 days.

(21) Appl. No.: 16/503,505

(22) Filed: Jul. 4, 2019

(65) Prior Publication Data
US 2019/0326366 A1 Oct. 24, 2019

Related U.S. Application Data

(60) Provisional application No. PCT/CN2018/091858, filed on Jun. 19, 2018.

(30) Foreign Application Priority Data

Sep. 30, 2017 (CN) .......................... 201710923386.7
Sep. 30, 2017 (CN) .......................... 201721282770.5

(Continued)

(51) Int. Cl.
H01L 27/32 (2006.01)
(52) U.S. Cl.
CPC ........ H01L 27/3218 (2013.01); H01L 27/326 (2013.01); H01L 27/3211 (2013.01);
(Continued)

(58) Field of Classification Search
CPC .............. H01L 27/3218; H01L 27/326; H01L 27/3211; H01L 27/3216; G09G 2300/0809
See application file for complete search history.

(56) References Cited

U.S. PATENT DOCUMENTS 9,395,548 B2 * 7/2016 Kroon .................. G09G 3/3208
9,441,828 B2 9/2016 Wu
(Continued)

FOREIGN PATENT DOCUMENTS

CN 102645779 A 8/2012
CN 103971600 A 8/2014
(Continued)

OTHER PUBLICATIONS

Office Action of the Corresponding Chinese Patent Application No. 201810135320.6 dated Feb. 3, 2020.
(Continued)

Primary Examiner — David A Zarneke
(74) Attorney, Agent, or Firm — Kilpatrick Townsend & Stockton

(57) ABSTRACT

Display screens and display devices are disclosed. The display screen includes: a first display region, a second display region adjacent to the first display region, and a third display region adjacent to the second display region. A sub-pixel density of the first display region is smaller than a sub-pixel density of the second display region. The sub-pixel density of the second display region is smaller than a sub-pixel density of the third display region. The display screens and the display devices according to the present application can improve the user experience.

19 Claims, 6 Drawing Sheets

(30) Foreign Application Priority Data

Feb. 9, 2018 (CN) .......................... 201810135320.6
Feb. 9, 2018 (CN) .......................... 201820240682.7

(52) U.S. Cl.
CPC ...... *H01L 27/3216* (2013.01); *H01L 27/3234* (2013.01); *H01L 27/3244* (2013.01)

(56) References Cited

U.S. PATENT DOCUMENTS

| | | | | |
|---|---|---|---|---|
| 9,818,803 | B2* | 11/2017 | Lee | H01L 27/3216 |
| 10,103,205 | B2* | 10/2018 | Gu | G09G 3/3225 |
| 10,854,684 | B2* | 12/2020 | Huangfu | G09G 3/3225 |
| 10,991,768 | B2* | 4/2021 | Li | H01L 27/3216 |
| 2013/0076236 | A1* | 3/2013 | Sumida | H01L 51/5275 |
| | | | | 313/504 |
| 2013/0278488 | A1* | 10/2013 | Huo | G06T 17/00 |
| | | | | 345/87 |
| 2014/0218971 | A1 | 8/2014 | Wu | |
| 2016/0062087 | A1 | 3/2016 | Lin | |
| 2016/0240593 | A1* | 8/2016 | Gu | H01L 27/3262 |
| 2016/0327803 | A1 | 11/2016 | Yamazaki et al. | |
| 2016/0357076 | A1 | 12/2016 | Huangfu et al. | |
| 2016/0358543 | A1 | 12/2016 | Rappoport | |
| 2017/0076654 | A1 | 3/2017 | Wang | |
| 2018/0175121 | A1* | 6/2018 | Ji | H01L 51/52 |
| 2019/0206310 | A1* | 7/2019 | Tian | H01L 27/3218 |

FOREIGN PATENT DOCUMENTS

| | | | |
|---|---|---|---|
| CN | 104597655 | A | 5/2015 |
| CN | 106921767 | A | 7/2017 |
| TW | I547748 | B | 9/2016 |
| TW | I599817 | B | 9/2017 |

OTHER PUBLICATIONS

CN First Office Action with Search Report dated Jun. 4, 2019 in the corresponding CN application (application No. 201810135320.6).
International Search Report dated Sep. 20, 2018 in the corresponding PCT application (application No. PCT/CN2018/091858).

\* cited by examiner

DISPLAY SCREENS AND DISPLAY DEVICES

CROSS REFERENCE TO RELATED APPLICATIONS

This application is a continue application for International Application PCT/CN2018/091858, filed on Jun. 19, 2018, which claims the priority benefit of Chinese Patent Application No. 201721282770.5, titled "DISPLAY SCREENS AND DISPLAY DEVICES" and filed on Sep. 30, 2017, Chinese Patent Application No. 201710923386.7, titled "DISPLAY SCREENS AND DISPLAY DEVICES" and filed on Sep. 30, 2017, Chinese Patent Application No. 201820240682.7, titled "DISPLAY SCREENS AND DISPLAY DEVICES" and filed on Feb. 9, 2018, and Chinese Patent Application No. 201810135320.6, titled "DISPLAY SCREENS AND DISPLAY DEVICES" and filed on Feb. 9, 2018. The entireties of the above identified applications are incorporated by reference herein for all purposes.

TECHNICAL FIELD

Exemplary embodiments of the present application relate to display technologies, and more particularly to display screens and display devices.

BACKGROUND

With a rapid development of a mobile electronic product industry and a continuous updating of new products, a market has higher and higher expectations for mobile electronic products. For example, products such as mobile phones have a developing trend from having a frame to having a narrow frame and frameless.

SUMMARY

Accordingly, it is necessary to provide a display screen and a display device that can truly realize a full screen display.

A display screen includes: a first display region; a second display region adjacent to the first display region; and a third display region adjacent to the second display region and located on an opposite side of a side of the second display region adjacent to the first display region. A sub-pixel density of the first display region is smaller than a sub-pixel density of the second display region. The sub-pixel density of the second display region is smaller than a sub-pixel density of the third display region.

In one of the embodiments, in the first display region, a first-typed light emitting unit is formed by sharing sub-pixels. In the second display region, a second-typed light emitting unit is formed by sharing sub-pixels. In the third display region, a third-typed light emitting unit is formed by arranging sub-pixels.

In one of the embodiments, the first-typed light emitting unit is distributed in a shape of a pair of triangles with a common edge and two vertices.

In one of the embodiments, the first-typed light emitting unit includes one red sub-pixel, two green sub-pixels, and one blue sub-pixel; the red sub-pixel and the blue sub-pixel are located on the common edge, and the green sub-pixels are located at the two vertices.

In one of the embodiments, the second-typed light emitting unit is distributed in a shape of a pair of triangles with a common vertex.

In one of the embodiments, the second-typed light emitting unit includes one red sub-pixel, two green sub-pixels, and two blue sub-pixels; the red sub-pixel is located at the common vertex, and the green sub-pixels and the blue sub-pixels are located at two other vertices of each of the triangles.

In one of the embodiments, the third-typed light emitting unit is distributed in a shape of a triangle.

In one of the embodiments, the third-typed light emitting unit includes one red sub-pixel, one green sub-pixel, and one blue sub-pixel; the three sub-pixels form vertices of the triangle, respectively.

In one of the embodiments, a smallest repeating unit of the first display region includes one first pixel unit and one first blank region adjacent to the first pixel unit.

In one of the embodiments, a smallest repeating unit of the second display region includes one second pixel unit and one second blank region adjacent to the second pixel unit, or includes two second pixel units and one second blank region.

In one of the embodiments, a smallest repeating unit of the third display region comprises one third pixel unit, and does not comprise a blank region.

In one of the embodiments, the smallest repeating units of the first display region of adjacent two rows or adjacent two columns are misaligned.

In one of the embodiments, the smallest repeating units of the second display region of adjacent two rows or adjacent two columns are misaligned.

In one of the embodiments, the smallest repeating units of the third display region of adjacent two rows or adjacent two columns are misaligned.

In one of the embodiments, the third display region forms a main display region of the display screen, and the first display region forms an auxiliary display region of the display screen; the first display region is located at a side portion of the display screen, and the second display region is a transition region between the first display region and the third display region.

In one of the embodiments, a ratio of a height of the first display region to a height of the display screen is 1:10.

A display device is further provided according to the present application, which includes a display screen and an under-screen photosensitive module. The display screen includes a first display region, a second display region adjacent to the first display region, and a third display region adjacent to the second display region and located on an opposite side of a side of the second display region adjacent to the first display region. A sub-pixel density of the first display region is smaller than a sub-pixel density of the second display region. The sub-pixel density of the second display region is smaller than a sub-pixel density of the third display region. The under-screen photosensitive module is disposed under the first display region for sensing light that is incident through the display screen.

In one of the embodiments, the under-screen photosensitive module is at least one of a photoelectric sensor and a camera.

In one of the embodiments, the under-screen photosensitive module senses light that is incident through the first display region and the second display region of the display screen.

In one of the embodiments, the under-screen photosensitive module is embedded under the display screen by 4 mm to 6 mm.

The technical solution provided by the present application has at least the following beneficial effects:

By adjust the sub-pixel density of the first display region where the camera is set on the display screen, not only a normal display requirement of the first display region is met, but also a requirement that a high light transmittance needs to be maintain at the camera is met. Since there is no need to reserve a position for the front camera, the non-display region above the effective display region can be omitted, a screen occupation ratio of the display screen can be enlarged, and the use experience can be optimized, so that the technical problem that the user experience may be poor due to the presence of the non-display region can be solved.

DETAILED DESCRIPTION OF THE EMBODIMENTS

The reduction of screen frame size affects placement of various front components. The absence of a frame on the top and bottom directly affects the placement of a front camera, a sensor, and a product identification. In order to realize a frameless or a narrow frame effect, a conventional mobile electronic device usually provides a slot or a mounting hole on the display to accommodate related devices, or directly removes the related devices. However, none of the above solutions can truly achieve a full screen display.

A method for manufacturing an organic light emitting display device can include the following steps.

Figure 1:
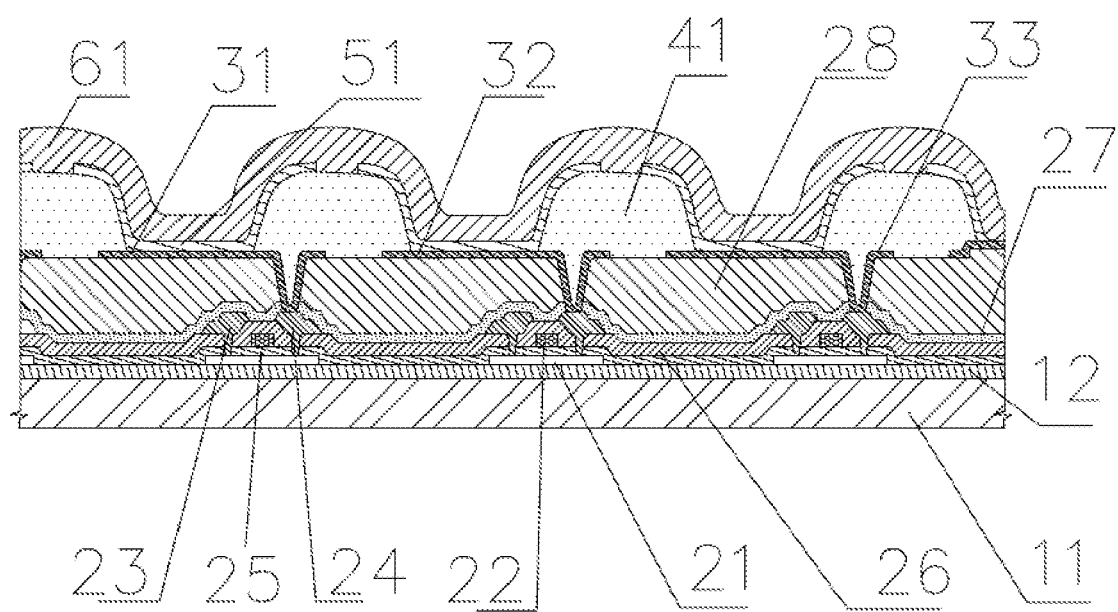
FIG. 1 is a schematic diagram of a layered structure of an organic light emitting display device according to an embodiment of the present application.

Referring to FIG. 1, firstly, a substrate 11 is provided. The substrate 11 has a first sub-pixel region, a second sub-pixel region, and a third sub-pixel region. A group of the first sub-pixel region, the second sub-pixel region, and the third sub-pixel region can constitute one pixel region. The substrate 11 can have a plurality of pixel regions. In an embodiment, the first sub-pixel region can be a sub-pixel region that emits red light. The second sub-pixel region can be a sub-pixel region that emits green light. The third sub-pixel region can be a sub-pixel region that emits blue light.

The substrate 11 can be made of a glass material, a metal material or suitable materials of plastic materials, such as a polyethylene terephthalate (PET), polyethylene naphthalate (PEN), or polyimide, etc. A thin film transistor (TFT) can be disposed on the substrate 11. In an embodiment, an additional layer such as a buffer layer 12 can be formed on the substrate 11 prior to forming the TFT. The buffer layer 12 can be formed on an entire surface of the substrate 11, or can be formed by being patterned.

The buffer layer 12 can have a suitable material including a material such as PET, PEN, polyacrylate, and/or polyimide to form a layered structure in a single layer or a multilayer stack. The buffer layer 12 can also be formed of silicon oxide or silicon nitride, or can comprise a composite layer of an organic material and/or an inorganic material.

The TFT can control a light emission of each sub-pixel, or can control a light emission amount of each sub-pixel when each sub-pixel emits light. The TFT can include a semiconductor layer 21, a gate electrode 22, a source electrode 23, and a drain electrode 24.

The semiconductor layer 21 can be formed of an amorphous silicon layer, a silicon oxide layer metal oxide or a polysilicon layer, or can be formed of an organic semiconductor material. In an embodiment, the semiconductor layer 21 includes a channel region, and source and drain regions doped with dopants.

The semiconductor layer 21 can be covered with a gate insulating layer 25. The gate electrode 22 can be disposed on the gate insulating layer 25. Generally, the gate insulating layer 25 can cover the entire surface of the substrate 11. In an embodiment, the gate insulating layer 25 can be formed by patterning. The gate insulating layer 25 can be formed of silicon oxide, silicon nitride, or other insulating organic or inorganic material in consideration of adhesion to an adjacent layer, formability of a stacked target layer, and surface flatness. The gate electrode 22 can be covered by an interlayer insulating layer 26 formed of silicon oxide, silicon nitride, and/or other suitable insulating organic or inorganic materials. A portion of the gate insulating layer 25 and the interlayer insulating layer 26 can be removed, and a contact hole is formed after removing so as to expose a predetermined region of the semiconductor layer 21. The source electrode 23 and the drain electrode 24 can contact the semiconductor layer 21 via the contact hole. In view of a conductivity, the source electrode 23 and the drain electrode 24 can be formed of a single material layer or a composite material layer including at least one material of aluminum (Al), Platinum (Pt), Palladium (Pd), Silver (Ag), Magnesium (Mg), Gold (Au), Nickel (Ni), neodymium (Nd), Iridium (Ir), Chromium (Cr), Lithium (Li), Calcium (Ca), Molybdenum (Mo), Titanium (Ti), Tungsten (W), Copper (Cu), or other suitable alloys.

A protective layer 27 formed of silicon oxide, silicon nitride, and/or other suitable insulating organic or inorganic material can cover the TFT. The protective layer 27 covers all or part of the substrate 11. Since the TFT having a complicated layer structure is disposed under the protective layer 27, a top surface of the protective layer 27 may not be sufficiently flat. It is therefore necessary to form a planarization layer 28 on the protective layer 27 in order to form a sufficiently flat top surface.

After the planarization layer 28 is formed, a through hole can be formed in the protective layer 27 and the planarization layer 28 so as to expose the drain electrode 24 of the TFT.

Then, the first sub-pixel electrode 31, the second sub-pixel electrode 32, and the third sub-pixel electrode 33 are formed on the planarization layer 28. The first sub-pixel electrode 31 is formed in the first pixel region. The second sub-pixel electrode 32 is formed in the second sub-pixel region. The third sub-pixel electrode 33 is formed in the third sub-pixel region. The first sub-pixel electrode 31, the second sub-pixel electrode 32, and the third sub-pixel electrode 33 can be formed simultaneously or synchronously herein. Each of the first sub-pixel electrode 31, the second sub-pixel electrode 32, and the third sub-pixel electrode 33 can be electrically connected to the TFT via the through hole. The first sub-pixel electrode 31, the second sub-pixel electrode 32, and the third sub-pixel electrode 33 are generally referred to as anodes herein.

Each of the first sub-pixel electrode 31, the second sub-pixel electrode 32, and the third sub-pixel electrode 33 can form a transparent electrode (transflective electrode) or a reflective electrode. When the first sub-pixel electrode 31, the second sub-pixel electrode 32, and the third sub-pixel electrode 33 form the transparent electrodes (transflective electrodes), the electrodes can be made of indium tin oxide (ITO), indium zinc oxide (IZO), zinc oxide (ZnO), indium oxide (In2O3), indium gallium oxide (IGO), or aluminum zinc oxide (AZO).

When the first sub-pixel electrode 31, the second sub-pixel electrode 32, and the third sub-pixel electrode 33 form the reflective electrodes, a reflective layer formed of silver (Ag), magnesium (Mg), aluminum (Al), platinum (Pt), palladium (Pd), gold (Au), Nickel (Ni), neodymium (Nd), iridium (Ir), chromium (Cr), or a mixture of any of these materials, and an auxiliary layer formed of a transparent electrode material such as indium tin oxide (ITO), indium zinc oxide (IZO), zinc oxide (ZnO), and indium oxide (In2O3) are superposed to form a reflective electrode layer. Structures and materials of the first sub-pixel electrode 31, the second sub-pixel electrode 32, and the third sub-pixel electrode 33 are not limited thereto and can be varied herein.

After the first sub-pixel electrode 31, the second sub-pixel electrode 32, and the third sub-pixel electrode 33 are formed, as shown in FIG. 1, a pixel defining layer (PDL) 41 can be formed. The formed PDL simultaneously covers the first sub-pixel electrode 31, the second sub-pixel electrode 32, and the third sub-pixel electrode 33. The PDL can be used to define a sub-pixel by providing an opening corresponding to each sub-pixel (i.e., an opening exposing a central portion of each sub-pixel). The PDL can be formed of the single material layer or composite layer including suitable organic materials such as polyacrylate and polyimide or suitable inorganic materials.

The PDL can be formed in a manner that a layer for PDL is formed on the entire surface of the substrate 11 by using a material suitable for PDL, so as to cover the first sub-pixel electrode 31, the second sub-pixel electrode 32, and the third sub-pixel electrode 33. Then, the PDL layer is patterned to expose central portions of the first sub-pixel electrode 31, the second sub-pixel electrode 32, and the third sub-pixel electrode 33, forming the openings corresponding to each of the sub-pixels.

A light emitting layer 51 can be formed by evaporating a light emitting material. The evaporation material covers a portion of the first sub-pixel electrode 31 that is not covered by the PDL layer, a portion of the second sub-pixel electrode 32 that is not covered by the PDL layer, a portion of the third sub-pixel electrode 33 that is not covered by the PDL layer, and the top surface of the PDL layer.

The light emitting material that emits red, green, and blue light can be evaporated by using a fine metal mask.

Then, a counter electrode 61 covering the first sub-pixel region, the second sub-pixel region, and the third sub-pixel region is formed by evaporating. The counter electrode 61 can be integrally formed with respect to a plurality of sub-pixels so as to cover an entire display region. The counter electrode 61 is commonly referred to as a cathode.

The counter electrode 61 contacts an electrode supply line at an outer side of the display region, so that the electrode supply line can receive an electrical signal. The counter electrode 61 can be formed as a transparent electrode or a reflective electrode. When the counter electrode 61 is formed as a transparent electrode, the counter electrode 61 can include a layer formed by depositing Li, Ca, LiF/Ca, LiF/Al, Al, Mg, or a mixture of any of these materials in a direction toward the light emitting layer, as well as the auxiliary electrode or a bus electrode line formed of the transparent (transflective) material including ITO, IZO, ZnO or In2O3. When the counter electrode 61 is formed as a reflective electrode, the counter electrode 61 can have a layer including one or more materials selected from Li, Ca, LiF/Ca, LiF/Al, Al, Ag, and Mg. However, the configuration and material of the counter electrode 61 are not limited thereto, and thus may be varied.

Figure 2:
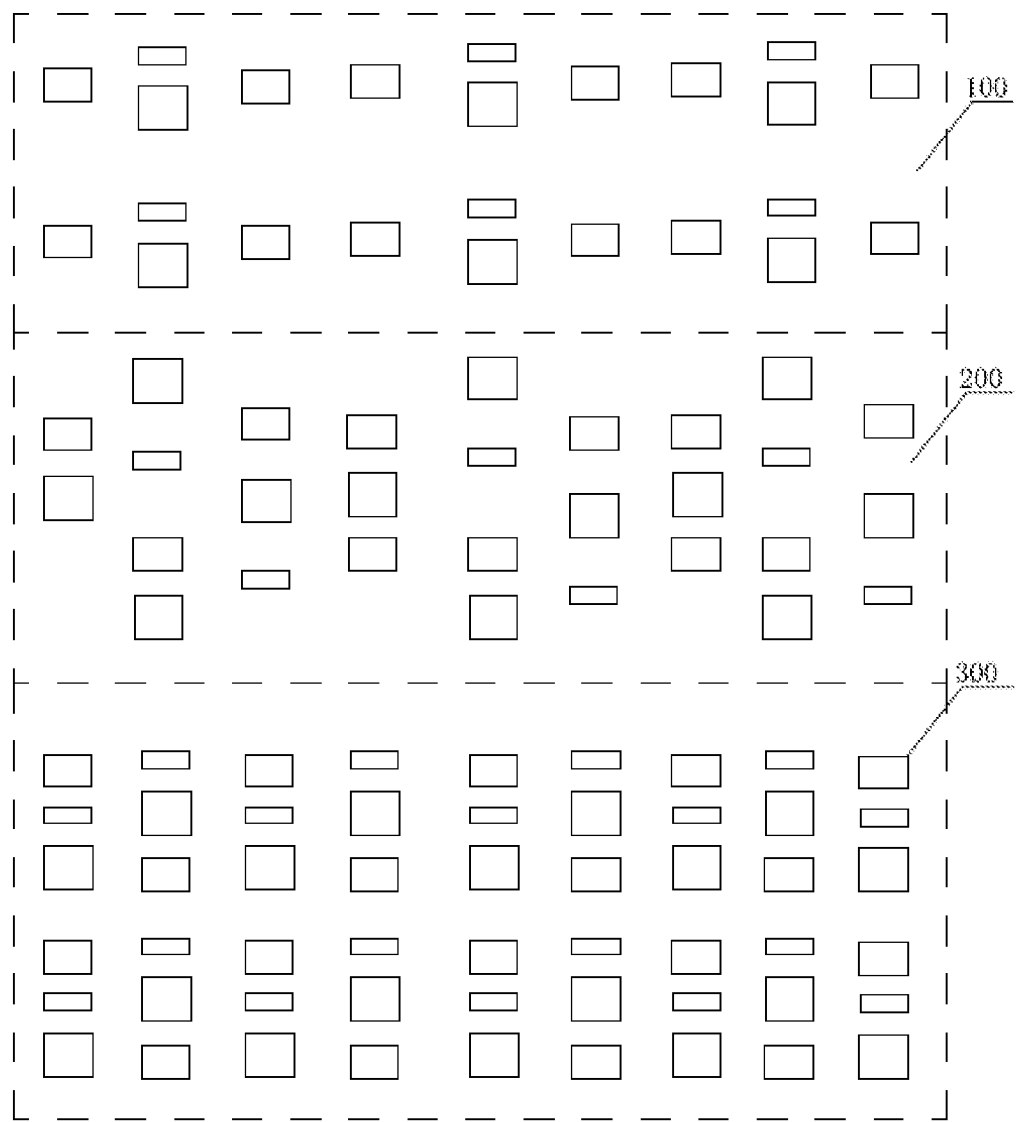
FIG. 2 is a schematic diagram of a sub-pixel structure of a display screen according to an embodiment of the present application.

Referring to FIG. 2, a display screen provided by the present application includes: a first display region 100, a second display region 200 adjacent to the first display region 100, a third display region 300 adjacent to the second display region 200 and located on an opposite side of a side of the second display region 200 adjacent to the first display region 100.

A sub-pixel density of the first display region 100 is smaller than a sub-pixel density of the second display region 200.

The sub-pixel density of the second display region 200 is smaller than a sub-pixel density of the third display region 300.

The third display region of the display screen has a higher sub-pixel density, and the third display region can be used as a main display region of the display screen; the first display region has a lower sub-pixel density, and the first display region can be used as an auxiliary display region of the display screen; the second display region can be used as a transition display region between the first display region and the third display region.

When the display screen is applied to the display device, an under-screen photosensitive module such as a front camera can be disposed under the first display region. Since the sub-pixel density of the first display region is small, it has a high light transmittance, which can satisfy the light required by the under-screen photosensitive module and can ensure a normal display of the first display region. Since there is no need to reserve a position for the under-screen photosensitive module such as the front camera on the display screen, a non-display region above the effective display region of the display screen can be omitted, thereby enlarging a screen occupation ratio of the display screen and optimizing the user experience.

Since the sub-pixel density of the second display region is greater than the sub-pixel density of the first display region and smaller than the sub-pixel density of the third display region, the second display region can be used to form a visual transition region, so that when the display screen displaying in full screen or entire screen, it is possible to effectively reduce the user's visual difference due to different sub-pixel densities between the first display region and the third display region.

In an embodiment provided by the present application, the display screen can be manufactured by using an active matrix organic light emitting diode (AMOLED) technology. For a specific manufacturing method, please refer to the aforementioned method of the organic light emitting display device. The AMOLED technology is a display technology in which an organic light emitting diode (OLED) pixel is deposited or integrated on a TFT array, and a current flowing into each OLED pixel is controlled by the TFT array to determine a light emitting intensity of each pixel.

For example, a specific implementation method of making the sub-pixel density of the first display region 100 smaller than the sub-pixel density of the second display region 200 can be the following: using the PDL layer to define the opening in order to deposit sub-pixels; then, evaporating the sub-pixels in the opening defined by the PDL layer using the evaporating process, so as to make the sub-pixel density of the first display region 100 smaller than the sub-pixel density of the second display region 200. It can be understood that the control of the sub-pixel density can be achieved by controlling the number of openings or an aperture ratio defined by the PDL layer. Of course, a same method can be used to make the sub-pixel density of the second display region 200 smaller than the sub-pixel density of the third display region 300.

In a specific application of the display screen, such as a mobile phone display screen. A conventional mobile phone display screen may include the first display region 100 for disposing the camera and the third display region 300 that is primarily used to display an image. In an embodiment shown in FIG. 2, the third display region 300 serves as the main display region of the display screen and is located in the middle of the display screen. The first display region 100 serves as the auxiliary display region of the display screen and is located on the upper side of the display screen. It should be noted that the positional relationship between the first display region 100 and the third display region 300 can be adjusted according to actual conditions. For example, the first display region 100 can be located on a left side, a right side, or a lower side of the third display region 300. Alternatively, the first display region 100 is distributed on a periphery of the third display region 300, and the third display region 300 is surrounded in the middle. As long as there are two regions in the display screen that have relatively different requirements for light intensity, it should be considered as without deviating from the scope of the substantial protection of the present application. At the same time, the second display region 200 for transition is disposed between the first display region 100 and the third display region 300.

Figure 3:
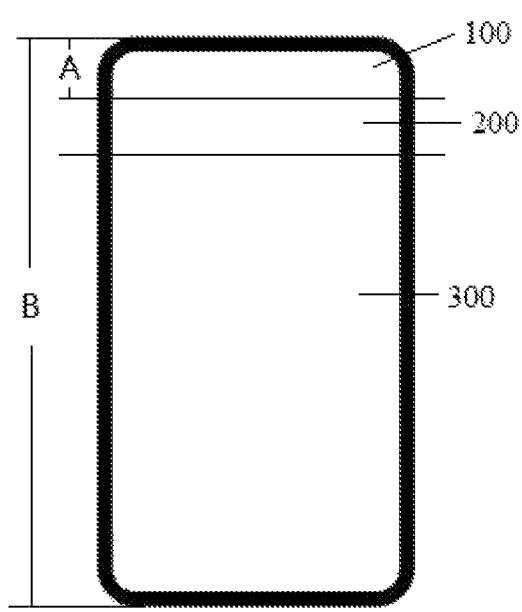
FIG. 3 is a schematic diagram of a display screen according to an embodiment of the present application.

In an embodiment, as shown in FIG. 3, a ratio of a height A of the first display region 100 to a height B of the display screen can be 1:10, that is, a height A of the first display region 100 is 1/10 of an overall height B of the display screen. In such an arrangement, not only the normal display of the first display region may not be affected, but also the under-screen photosensitive module disposed under the first display region can obtain light from a pixel gap of the first display region to implement a front camera function. Thus, the display screen can realize full screen or entire screen display while ensuring the front camera function.

Figure 4:
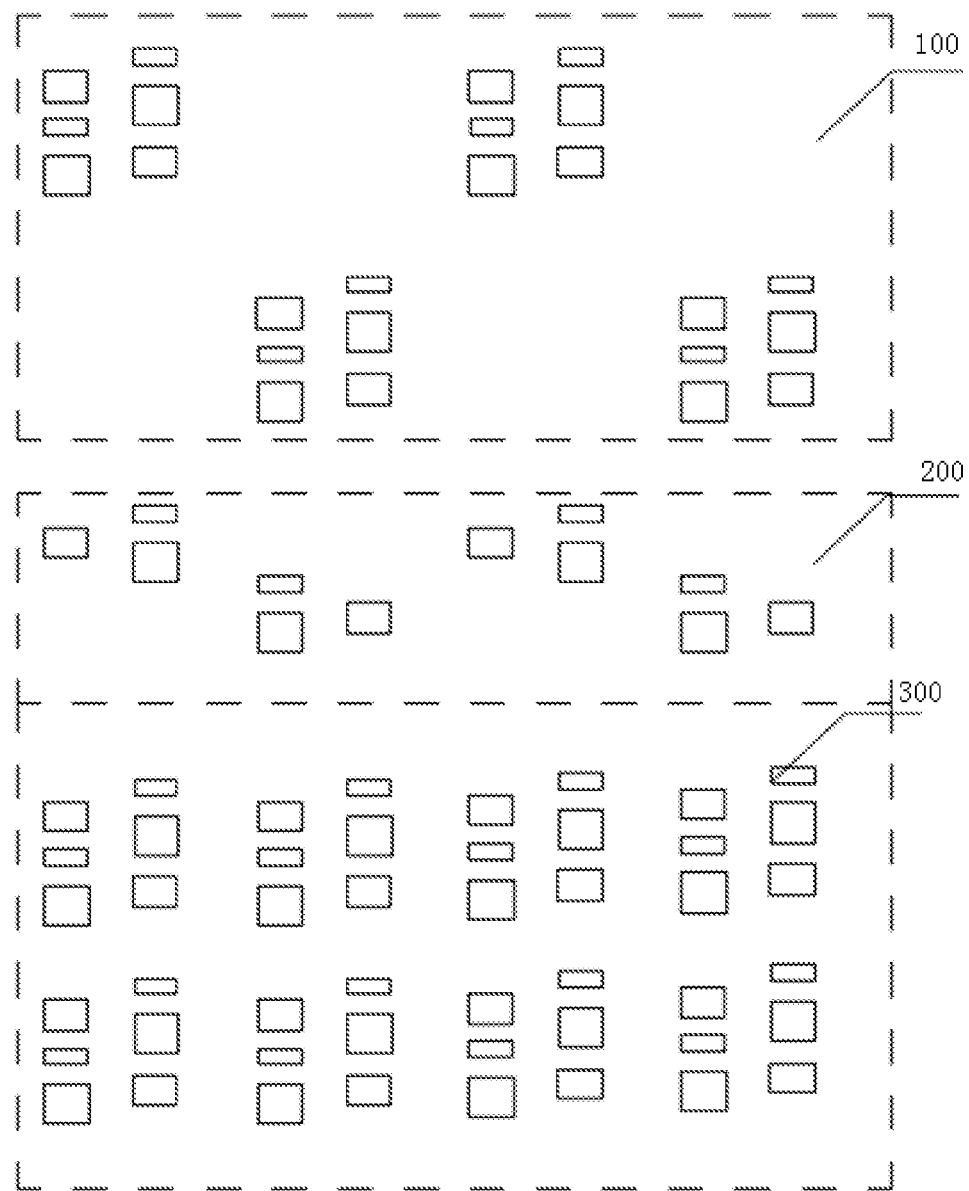
FIG. 4 is another schematic diagram of a sub-pixel structure of a display screen according to an embodiment of the present application.

Please refer to FIG. 4. FIG. 4 is another embodiment of the present application. Similarly, in the embodiment shown in FIG. 4, the third display region 300 serves as the main display region of the display screen and is distributed in the middle of the display screen. The first display region 100 serves as the auxiliary display region of the display screen and is distributed on the upper side of the display screen. It should be noted that the positional relationship between the first display region 100 and the third display region 300 can be adjusted according to the actual conditions. For example, the first display region 100 can be located on the left side, the right side, or the lower side of the third display region 300. Alternatively, the first display region 100 is distributed on the periphery of the third display region 300, and the third display region 300 is surrounded in the middle. As long as there are two regions in the display screen that have relatively different requirements for light intensity, it should be considered as without deviating from the scope of the substantial protection of the present application. At the same time, the second display region 200 for transition is disposed between the first display region 100 and the third display region 300.

When the display screen of an embodiment is applied to a display device including a front camera, the sub-pixel density of the display region where the front camera is provided can be adjusted, so as to meet a requirement of a normal display of the display region where the camera is located, and also meet a requirement of maintaining high light transmittance at the camera. Since there is no need to reserve a position for the front camera, the non-display region above the effective display region of the display screen can be omitted, the screen ratio of the display screen can be enlarged, and the user experience can be optimized. Thus, the technical problem of poor user experience due to the presence of the non-display region of the display screen can be solved.

Further, in an embodiment of the present application, in the first display region, a first-typed light emitting unit is formed by sharing sub-pixels according to a first manner.

In the second display region, a second-typed light emitting unit is formed by sharing sub-pixels according to a second manner.

In the third display region, a third-typed light emitting unit is formed by arranging sub-pixels according to a third manner.

Figure 5:
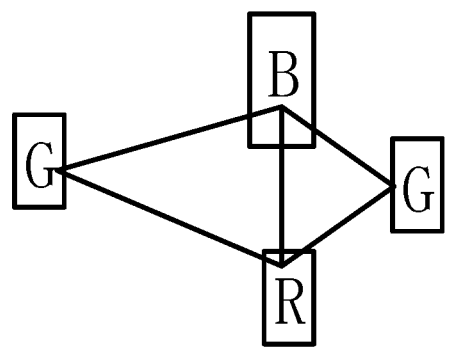
FIG. 5 is a schematic diagram of a sub-pixel sharing structure of a first-typed light emitting unit in FIG. 2.
Figure 6:
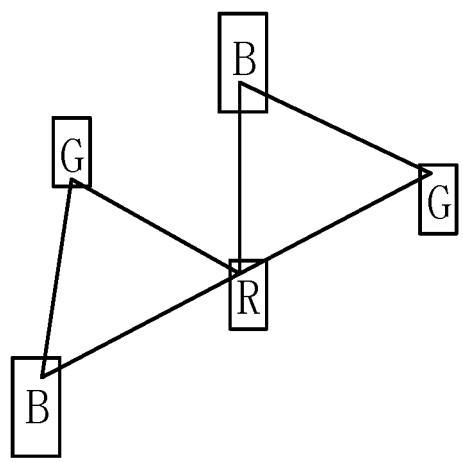
FIG. 6 is a schematic diagram of a sub-pixel sharing structure of a second-typed light emitting unit in FIG. 2.

Referring to FIG. 2, it can be understood that the first-typed light emitting unit shares the sub-pixels in a manner shown in FIG. 5. The second-typed light emitting unit shares the sub-pixels in the manner shown in FIG. 6. The third-typed light emitting unit does not share the sub-pixels. In FIG. 5 and FIG. 6, R represents a red sub-pixel, G represents a green sub-pixel, and B represents a blue sub-pixel.

Further, in an embodiment of the present application, the first-typed light emitting unit is distributed in a shape of a pair of triangles with a common edge.

Further, in an embodiment of the present application, the first-typed light emitting unit includes one red sub-pixel, two green sub-pixels, and one blue sub-pixel; the red sub-pixel and the blue sub-pixel are located on the common edge of the pair of triangles, and the green sub-pixels are located at two other vertices of the pair of triangles. It should be understood that since the organic light emitting diode OLED relies on the light emitting material to emit light, and the light emitting materials of different colors have different decay rates. Generally, the red light emitting material has the slowest decay rate among the three colors. It has the longest light emitting life. On the other hand, green light is the most sensitive color of a human eye in red, green, and blue. Therefore, if the number of green sub-pixels is reduced, it will be easily felt by the human eye. Therefore, the present application uses the red sub-pixel and the blue sub-pixel as the sharing pixel so as to avoid affecting a human visual perception after the pixels are shared, and balance the light emitting lifetime of each color sub-pixel.

Specifically, referring to FIG. 5, the first-typed light emitting unit includes one red sub-pixel, two green sub-pixels, and one blue sub-pixel. The red sub-pixel and the blue sub-pixel are located on the common edge of the pair of triangles, and the green sub-pixels are located at two other vertices of the pair of triangles, such that the first-typed light emitting unit is distributed in a shape of the pair of triangles with the common edge.

Further, in an embodiment provided by the present application, the second-typed light emitting unit is distributed in a shape of a pair of triangles with a common vertex.

Further, in an embodiment of the present application, the second-typed light emitting unit can include one red sub-pixel, two green sub-pixel, and two blue sub-pixels. The red sub-pixel is located at the common vertex of the pair of triangles, and the green sub-pixels and blue sub-pixels are located at two other vertices of the triangles. In the present embodiment, only the red sub-pixel is used as the sharing pixel, and the light emitting lifetime of each color sub-pixel can be balanced while reducing the pixel density.

Specifically, referring to FIG. 6, the second-typed light emitting unit includes one red sub-pixel, two green sub-pixels, and two blue sub-pixels. The red sub-pixel is located at the common vertex of the pair of triangles, and the green sub-pixels and blue sub-pixels are located at two other vertices of the triangles, respectively, so that the second-typed light emitting unit is distributed in a shape of a pair of triangles with a common vertex.

Further, in an embodiment of the present application, the third-typed light emitting unit is distributed in a shape of triangle.

As can be seen from FIG. 2, in the third display region 300, the third-typed light emitting unit can be considered that the three sub-pixels are alternated and distributed in the shape of the triangle.

It should be noted that the light emitting unit of the first display region 100, the light emitting unit of the second display region 200, and the light emitting unit of the third display region 300 are not limited to be formed according to the afore-described manners, and the light emitting unit in each display region can include other combinations of red sub-pixels, green sub-pixels, and blue sub-pixels, and these sub-pixels can be formed in other shapes of distributions.

In still another embodiment of the present application, the first sub-pixel, the second sub-pixel, and the third sub-pixel are the red sub-pixel, the green sub-pixel, and the blue sub-pixel, respectively.

The first sub-pixel, the second sub-pixel, and the third sub-pixel can emit color lights of different colors, for example, can be three colors of red (R), green (G), and blue (B). The color lights emitted by the three sub-pixels are different from each other.

Further, in an embodiment of the present application, in the first display region, a blank region is reserved according to a first manner to form the first-typed light emitting unit.

In the second display region, a blank region is reserved in a second manner to form the second-typed light emitting unit.

In the third display region, the sub-pixels are arranged in a third manner to form the third-typed light emitting unit.

Referring to FIG. 4, in still another embodiment provided by the present application, the smallest repeating unit of the first display region 100 can include a first pixel unit and a first blank region. The first pixel unit is adjacent to the first blank region.

A span ratio of the first blank region and the first pixel unit can be set according to an actual demand. The span ratio is a ratio of a width of the blank region to a width of the pixel unit. For example, in an embodiment, the span ratio of the first blank region and the first pixel unit is 1, that is, the number of first pixel unit that can be carried by the first blank region is one; in another embodiment, the span ratio of the first blank region and the first pixel unit is 2, that is, the number of the first pixel unit that can be carried by the first blank region is two.

A first pixel unit of the first display region 100 can include a first sub-pixel, a second sub-pixel, and a third sub-pixel. Any one of the first sub-pixel, the second sub-pixel, and the third sub-pixel can be one of the red sub-pixel, the green sub-pixel, and the blue sub-pixel. Of course, the first sub-pixel, the second sub-pixel, and the third sub-pixel can also be sub-pixels of other colors.

In an embodiment, the first pixel unit can include at least one red sub-pixel, one green sub-pixel, and one blue sub-pixel. Specifically, for example, the first pixel unit can include two red sub-pixels, two green sub-pixels, and two blue sub-pixels.

In an embodiment, a smallest repeating unit of the second display region 200 can include two second pixel units and one second blank region. In another embodiment, the smallest repeating unit of the second display region 200 can also include one second pixel unit and one second blank region adjacent thereto.

The span ratio of the second blank region and the second pixel unit can be set according to the actual demand. The span ratio is a ratio of a width of the blank region to a width of the pixel unit. For example, in an embodiment, the span ratio of the second blank region and the second pixel unit is 1, that is, the number of second pixel units that can be carried by the second blank region is one; in another embodiment, the span ratio of the second blank region and the second pixel unit is 2, that is, the number of second pixel units that can be carried by the second blank region is two.

A second pixel unit of the second display region 200 can include a first sub-pixel, a second sub-pixel, and a third sub-pixel. Any one of the first sub-pixel, the second sub-pixel, and the third sub-pixel can be one of the red sub-pixel, the green sub-pixel, and the blue sub-pixel. Of course, the first sub-pixel, the second sub-pixel, and the third sub-pixel can also be sub-pixels of other colors.

In an embodiment, the second pixel unit can include at least one red sub-pixel, one green sub-pixel, and one blue sub-pixel. Specifically, for example, the second pixel unit can include three sub-pixels of one red sub-pixel, one green sub-pixel, and one blue sub-pixel.

It should be noted that the number of first pixel units and the first blank regions included in the smallest repeating unit of the first display area 100, the span ratio of the first pixel unit and the first blank region, the number of the second pixel units and the second blank regions included in the smallest repeating unit of the second display region 200 and the span ratio of the second pixel unit and the second blank region are not limited herein, as long as the sub-pixel density of the second display region is larger than the sub-pixel density of the first display region.

A smallest repeating unit of the third display region 300 can include one third pixel unit. The third pixel unit can include the first sub-pixel, the second sub-pixel, and the third sub-pixel. Any one of the first sub-pixel, the second sub-pixel, and the third sub-pixel can be one of the red sub-pixel, the green sub-pixel, and the blue sub-pixel. Of course, the first sub-pixel, the second sub-pixel, and the third sub-pixel may also be sub-pixels of other colors.

Since the sub-pixels of the third display region 300 are not provided with the blank region therebetween, the third display region 300 can have the highest sub-pixel density.

In an embodiment, the third pixel unit can include at least one red sub-pixel, one green sub-pixel, and one blue sub-pixel. Specifically, for example, the third pixel unit can include one red sub-pixel, one green sub-pixel, and one blue sub-pixel.

It should be noted that the structure of the smallest repeating unit of the third display region 300 is not limited herein. The smallest repeating unit of the third display region 300 can also include a blank region, as long as the sub-pixel density of the third display region is larger than the sub-pixel density of the second display region.

Further, in still another embodiment of the present application, the smallest repeating units of the adjacent two rows or adjacent two columns are misaligned.

In order to display evenly, the smallest repeating units are misaligned to improve the display effect. Specifically, the smallest repeating units of the adjacent two rows or adjacent two columns can be misaligned. Since the smallest repeating unit is misaligned, the sub-pixels or the blank regions are evenly distributed.

Figure 7:
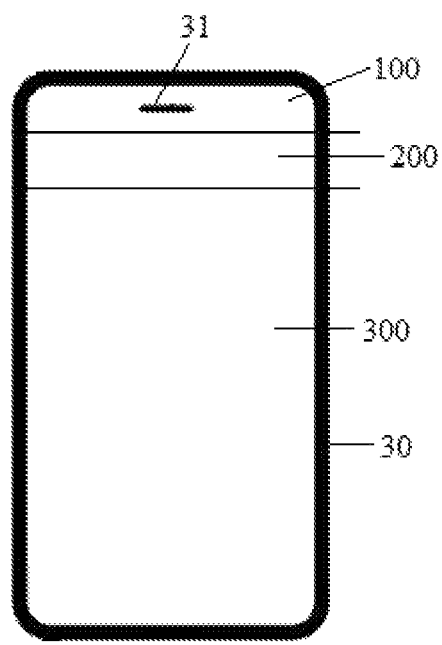
FIG. 7 is a schematic diagram of a display device according to an embodiment of the present application.

Further, as shown in FIG. 7, the present application further provides a display device, which includes the display screen 30 and the under-screen photosensitive module 31.

The display screen 30 includes:

the first display region 100, the second display region 200 adjacent to the first display region 100, and the third display region 300 adjacent to the second display region 200 and located on an opposite side of a side of the second display region 200 adjacent to the first display region 100.

The sub-pixel density of the first display region 100 is smaller than the sub-pixel density of the second display region 200.

The sub-pixel density of the second display region 200 is smaller than the sub-pixel density of the third display region 300.

The under-screen photosensitive module 31 is disposed under the first display region 100 and is capable of sensing light that is incident through the display screen.

Since the first display region has a lower sub-pixel density, and the under-photosensitive module is disposed under the first display region, so that light can be transmitted from the pixel gap of the first display region to implement the function of the under-screen photosensitive module. At the same time, the full screen or entire screen display of the display is realized.

In an embodiment, the under-screen photosensitive module is capable of sensing light that is incident through the first display region and the second display region of the display screen.

The first display region 100, the second display region 200, and the third display region 300 of the display screen have been described in detail above, and details thereof are not described herein again.

In a specific application of the present application, the under-screen photosensitive module can be a camera, a photoelectric sensor, or the like. The photoelectric sensor can specifically be an infrared sensor for measuring whether a human face is close to the display screen.

It can be understood that the display device herein can be understood as a separate product such as a mobile phone, a tablet computer or the like. The display device can also include a DC power source, a DC or AC power source interface, a memory, a processor, or the like.

The DC power source herein can be a lithium battery in a specific application. The DC power supply or AC power interface can be a micro-USB plug interface in a specific application. The memory can be a flash chip. The processor can be a Central Processing Unit (CPU) having a computing function, a single chip microcomputer, or the like.

Further, in an embodiment provided by the present application, the under-screen photosensitive module is at least one of a photoelectric sensor and a camera.

Of course, the under-screen photosensitive module is not limited herein, and the under-screen photosensitive module can be provided as needed.

Further, in an embodiment of the present application, the under-screen photosensitive module is embedded under the display screen by 4 mm to 6 mm.

It can be understood that, in the display screen, as the depth of light propagation increases, the light intensity decreases. When the under-screen photosensitive module is embedded in the display screen by a depth of 4 mm-6 mm, not only to a stable assembly of the under-screen photosensitive module can be ensured, but also the light intensity within a required range can be ensured. In this way, the display screen can realize the full screen or entire screen display while ensuring the normal operation of the under-screen photosensitive module.

The forgoing embodiments are merely illustrative of several embodiments of the present disclosure, and the description thereof is more specific and detailed, but is not intended to limit the scope of the present disclosure. It should be noted that a number of variations and modifications can be made by those skilled in the art without departing from the spirit and scope of the present disclosure. Therefore, the scope of the present disclosure should be determined by the appended claims.

The invention claimed is:

1. A display screen, comprising:
   a first display region configured as an auxiliary display region for disposing a camera, the first display region comprising a first plurality of sub-pixels and being characterized by a first pixel arrangement pattern;
   a second display region adjacent to the first display region, the second display region comprising a second plurality of sub-pixels and being characterized by a second pixel arrangement pattern; and
   a third display region adjacent to the second display region and located on an opposite side of a side of the second display region adjacent to the first display region, the third display region comprising a third plurality of sub-pixels, the third display region being configured as a primary display region and characterized by a third pixel arrangement pattern, the second display region being configured as a transition region between the first display region and the third display region;
   wherein:
   the first pixel arrangement pattern, the second pixel arrangement pattern, and the third pixel arrangement pattern are substantially different from each other;
   the first plurality of sub-pixels, the second plurality of sub-pixels, and the third plurality of sub-pixels are of a substantially same size;
   a sub-pixel density of the first display region is smaller than a sub-pixel density of the second display region;
   the sub-pixel density of the second display region is smaller than a sub-pixel density of the third display region;
   the first display region comprises a first-typed light emitting unit arranged in a shape of a pair of triangles sharing a common edge, the pair of triangles comprises a first triangle and a second triangle, the first triangle is characterized by a first distance between a first vertex and the common edge, the second triangle is characterized by a second distance between a second vertex and the common edge, and the first distance is greater than the second distance; and the second-typed light emitting unit is distributed in a shape of a pair of triangles with a common vertex.

2. The display screen of claim 1, wherein
the second-typed light emitting unit is formed by sharing sub-pixels at the second display region; and
a third-typed light emitting unit is formed by arranging sub-pixels, at the third display region.

3. The display screen of claim 1, wherein the first-typed light emitting unit comprises one red sub-pixel, two green sub-pixels, and one blue sub-pixel, the red sub-pixel and the blue sub-pixel being located on the common edge, and the green sub-pixels being located at the two vertices.

4. The display screen of claim 1, wherein the second-typed light emitting unit comprises one red sub-pixel, two green sub-pixels, and two blue sub-pixels, the red sub-pixel being located at the common vertex, and the green sub-pixels and the blue sub-pixels being located at two other vertices of each of the triangles.

5. The display screen of claim 2, wherein the third-typed light emitting unit is distributed in a shape of a triangle.

6. The display screen of claim 5, wherein the third-typed light emitting unit comprises one red sub-pixel, one green sub-pixel, and one blue sub-pixel, the red sub-pixel and the green sub-pixel and the blue sub-pixel respectively forming vertices of the triangle.

7. The display screen of claim 1, wherein a smallest repeating unit of the second display region comprises one second pixel unit and one second blank region adjacent to the second pixel unit, or comprises two second pixel units and one second blank region.

8. The display screen of claim 1, wherein a smallest repeating unit of the third display region comprises one third pixel unit, and does not comprise a blank region.

9. The display screen of claim 1, wherein the smallest repeating units of the first display region of adjacent two rows or adjacent two columns are misaligned.

10. The display screen of claim 7, wherein the smallest repeating units of the second display region of adjacent two rows or adjacent two columns are misaligned.

11. The display screen of claim 8, wherein the smallest repeating units of the third display region of adjacent two rows or adjacent two columns are misaligned.

12. The display screen of claim 1, wherein a ratio of a height of the first display region to a height of the display screen is 1:10.

13. A display device, comprising a display screen and an under-screen photosensitive module;
wherein:
the display screen comprises:
a first display region configured as an auxiliary display region for disposing a camera, the first display region comprising a first plurality of sub-pixels and being characterized by a first pixel arrangement pattern;
a second display region adjacent to the first display region, the second display region comprising a second plurality of sub-pixels and being characterized by a second pixel arrangement pattern; and
a third display region adjacent to the second display region and located on an opposite side of a side of the second display region adjacent to the first display region, the third display region comprising a third plurality of sub-pixels, the third display region being configured as a primary display region and characterized by a third pixel arrangement pattern, the second display region being configured as a transition region between the first display region and the third display region;
the first pixel arrangement pattern, the second pixel arrangement pattern, and the third pixel arrangement pattern are substantially different from each other;
the first plurality of sub-pixels, the second plurality of sub-pixels, and the third plurality of sub-pixels are of a substantially same size;
a sub-pixel density of the first display region being smaller than a sub-pixel density of the second display region;
the sub-pixel density of the second display region being smaller than a sub-pixel density of the third display region;
the first display region comprises a first-typed light emitting unit arranged in a shape of a pair of triangles sharing a common edge, the pair of triangles comprises a first triangle and a second triangle, the first triangle is characterized by a first distance between a first vertex and the common edge, the second triangle is characterized by a second distance between a second vertex and the common edge, and the first distance is greater than the second distance, the first display region further comprises a smallest repeating unit, the smallest repeating unit comprises a first pixel unit and a first blank region coupled to the first pixel unit, the first pixel unit comprises two red sub-pixels, two green sub-pixels, and two blue sub-pixels, and an area of the first pixel unit is equal to an area of the first blank region;
the under-screen photosensitive module being disposed under the first display region for sensing light that is incident through the display screen.

14. The display device of claim 13, wherein the under-screen photosensitive module is at least one of a photoelectric sensor and a camera.

15. The display device of claim 13, wherein the under-screen photosensitive module senses light that is incident through the first display region and the second display region of the display screen.

16. The display device of claim 13, wherein the under-screen photosensitive module is embedded under the display screen by 4 mm to 6 mm.

17. The display screen of claim 1, further comprising a pixel defining layer defining a sub-pixel by providing an opening corresponding to the sub-pixel;
wherein the pixel defining layer comprises an organic material selected from the group consisting of polyacrylate and polyimide.

18. The display screen of claim 17, wherein the pixel defining layer comprises a patterned configuration, the patterned configuration is associated with the first pixel arrangement pattern, the second pixel arrangement pattern, and the third pixel arrangement pattern.

19. The display screen of claim 1 wherein:
the first display region is characterized by a first light intensity requirement;
the third display region is characterized by a second light intensity requirement, the first light intensity requirement being different from the second light intensity requirement; and
the second display region is characterized by a third light intensity requirement that is between the first light intensity requirement and the second light intensity requirement.

* * * * *